(12) United States Patent
McNeil et al.

(10) Patent No.: US 12,131,028 B2
(45) Date of Patent: Oct. 29, 2024

(54) PROGRAMMING SELECTIVE WORD LINES DURING AN ERASE OPERATION IN A MEMORY DEVICE

(71) Applicant: MICRON TECHNOLOGY, INC., Boise, ID (US)

(72) Inventors: Jeffrey S. McNeil, Nampa, ID (US); Jonathan S. Parry, Boise, ID (US); Ugo Russo, Boise, ID (US); Akira Goda, Tokyo (JP); Kishore Kumar Muchherla, Fremont, CA (US); Violante Moschiano, Avezzano AQ (IT); Niccolo' Righetti, Boise, ID (US); Silvia Beltrami, Almenno San Bartolomeo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/121,494

(22) Filed: Mar. 14, 2023

(65) Prior Publication Data
US 2023/0289062 A1 Sep. 14, 2023

Related U.S. Application Data

(60) Provisional application No. 63/319,753, filed on Mar. 14, 2022.

(51) Int. Cl.
 *G06F 3/00* (2006.01)
 *G06F 3/06* (2006.01)
(52) U.S. Cl.
 CPC .......... *G06F 3/0611* (2013.01); *G06F 3/0659* (2013.01); *G06F 3/0679* (2013.01)
(58) Field of Classification Search
 None
 See application file for complete search history.

(56) References Cited

U.S. PATENT DOCUMENTS

2021/0375386 A1* 12/2021 Guo ................ G11C 29/50004

* cited by examiner

*Primary Examiner* — Midys Rojas
(74) *Attorney, Agent, or Firm* — Lowenstein Sandler LLP

(57) ABSTRACT

Control logic in a memory device causes a first pulse to be applied to a plurality of word lines coupled to respective memory cells in a memory array during an erase operation. The control logic further causes a second pulse to be applied to a first set of word lines of the plurality of word lines to bias the first set of word lines to a first voltage. The control logic can cause a third pulse to be applied to a second set of word lines of the plurality of word lines to bias the second set of word lines to a second voltage and cause a fourth pulse to be applied to a source line of the memory array to erase the respective memory cells coupled to the first set of word lines and to program the respective memory cells coupled to the second set of word lines.

20 Claims, 7 Drawing Sheets

US 12,131,028 B2

PROGRAMMING SELECTIVE WORD LINES DURING AN ERASE OPERATION IN A MEMORY DEVICE

RELATED APPLICATION

This application claims the benefit of U.S. Provisional Application 63/319,753 filed on Mar. 14, 2022, the entire content of which is incorporated by reference herein.

TECHNICAL FIELD

Embodiments of the disclosure relate generally to memory sub-systems, and more specifically, relate to a programming selective word lines during an erase operation in memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
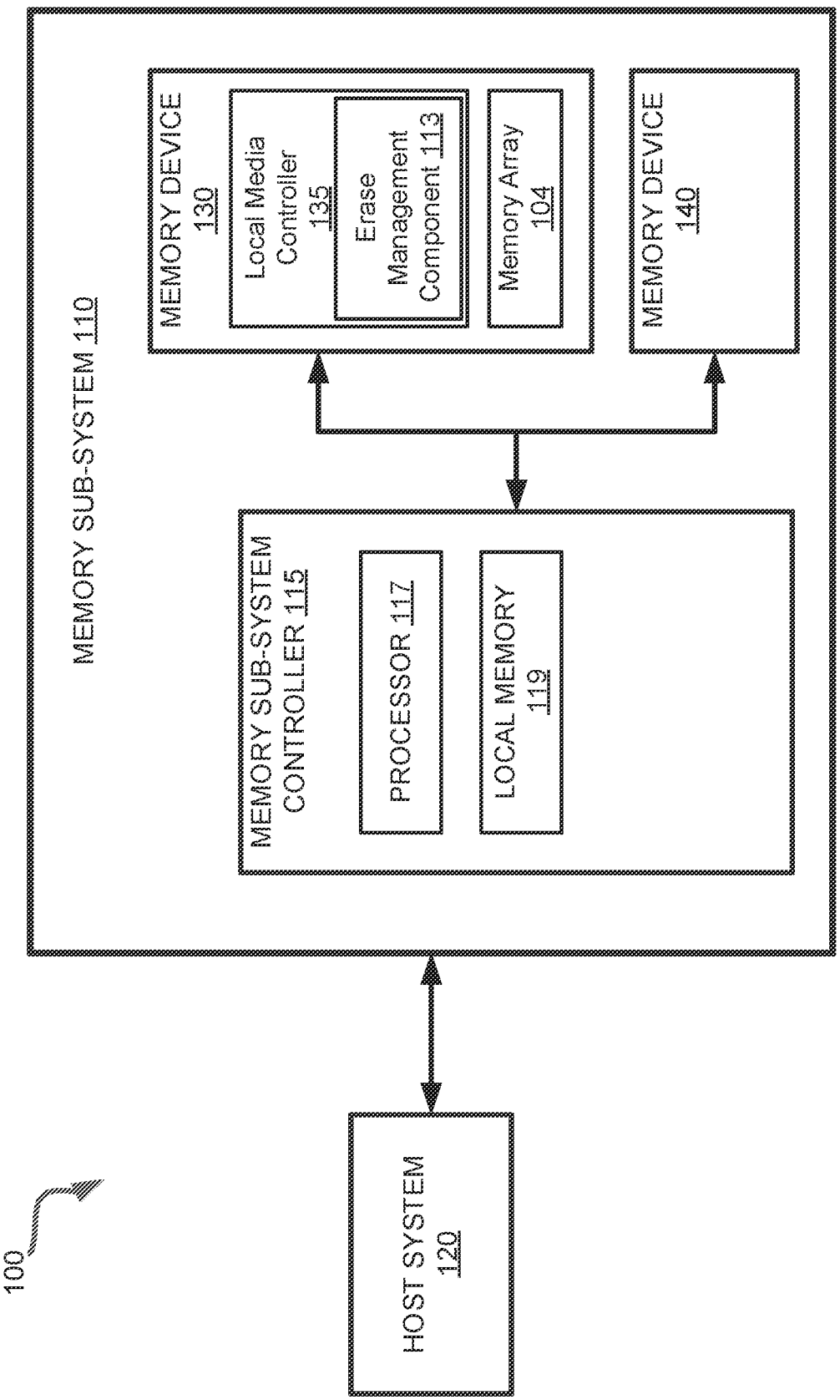
FIG. 1A illustrates an example computing system that includes a memory sub-system, in accordance with some embodiments of the present disclosure.

Aspects of the present disclosure are directed to programming selective word lines during an erase operation in a memory device of a memory sub-system. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bit lines) and rows (also hereinafter referred to as word lines). A word line can refer to one or more rows of memory cells of a memory device that are used with one or more bit lines to generate the address of each of the memory cells. The intersection of a bit line and word line constitutes the address of the memory cell. A block hereinafter refers to a unit of the memory device used to store data and can include a group of memory cells, a word line group, a word line, or individual memory cells. One or more blocks can be grouped together to form separate partitions (e.g., planes) of the memory device in order to allow concurrent operations to take place on each plane. Some memory device can also have multiple memory die (e.g., a group of cells etched on a respective silicon wafer), where each memory die can include a number of planes. Each data block can include a number of sub-blocks, where each sub-block is defined by an associated pillar (e.g., a vertical conductive trace) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "word lines," often fabricated in common with the memory cells, so as to form an array of strings in a block of memory. The compact nature of certain non-volatile memory devices, such as 3D flash NAND memory, means word lines are common to many memory cells within a block of memory.

The reliability of data stored at a memory cell can decrease over time. For example, a threshold voltage or a threshold distribution of multiple memory cells can shift over time (e.g., voltage threshold drift can occur). Some memory cells can be corrupt or unreadable due to the voltage threshold drift, temperature, or other stresses on the memory cell. Additionally, word lines can exhibit variations within a block and across blocks e.g., one word line of the block can be more unreliable than another word line of the block due to deviations in the manufacturing process. For example, the memory device can determine a read window budget (RWB)

margin for each word line to determine which word lines are ineffective or corrupt. The memory device can also periodically perform scan operations on blocks to check the reliability of the data stored. For example, the memory device can read a page in a block from each plane to determine if memory cells have shifted logic states or are unreadable, determine error rates, or determine how many bits are allowed to fail before a codeword stored across memory cells is unreadable or corrupted. To continue using the memory cells that are not corrupt in a block, the memory device can retire (e.g., sacrifice) word lines that exceed the error thresholds as determined during the scan operation or based on determining the RWB margin—e.g., not store user data at word lines coupled to respective memory cells that are corrupted but store data at the remaining respective memory cells coupled to unretired word lines to increase the total bytes written (TWB) of each block. To ensure word lines adjacent to the retired word lines continue to store data reliably, the memory device can program dummy data (e.g., data that is not user data or data associated with a host system) to respective memory cells coupled to the retired word lines. That is, because the memory device can utilize random data patterns (e.g., be programmed to operate with data stored randomly across the block), the respective memory cells coupled to the retired word line can be programmed with dummy data to avoid disturbing or otherwise affecting data stored at adjacent word lines—e.g. having respective memory cells of the retired word lines be not programmed (e.g., erased) can cause disturb on adjacent word lines and affect the reliability of the data stored.

Some memory devices can program the dummy data to respective memory cells of retired word lines during a program operation. In such instances, the control logic of the memory device can program the data sequentially—e.g., program a first sub-block or page coupled with a first word line, then a second sub-block coupled with the first word line, and then a first sub-block coupled with a second word line, and so forth. Accordingly, the control logic can pause programming user data (e.g., host data) and instead program dummy data when the programming operation gets to a retired word line. For example, the control logic can program respective memory cells coupled with a first word line with user data and then pause the program operation to program dummy data to a second retired word line and resume the program operation to program respective memory cells coupled with a third word line. Additionally, to program the dummy data to the retired word lines, the control logic can receive dummy data from a memory sub-system controller—e.g., data can be transferred from the system controller to the control logic for each page or sub-block to be programmed with dummy data. For example, if there are three (3) retired word lines, each associated with four (4) sub-blocks, to program with dummy data, dummy data can be transferred twelve (12) times—e.g., there can be twelve (12) program times dedicated to programming the twelve (12) sub-blocks, where the channel between the memory sub-system controller and the control logic of the memory device is occupied each time to drive the dummy data. Accordingly, a write performance of the memory device can be degraded as a host system waits an n number of program times during a program operation, where n is the number of sub-blocks to be programmed with dummy data. In some memory devices, writing the dummy data to the respective memory cells coupled with the retired word lines occurs every program/erase (P/E) causing the write performance degradation during each P/E cycle.

Aspects of the present disclosure address the above and other deficiencies by selectively programming retired word lines during an erase operation—e.g., inhibit the retired word lines from being erased during the erase operation. In an embodiment, control logic of a memory device can receive an erase command that specifies valid (e.g., unretired) word lines and retired word lines of a block of the memory array. For example, the erase command can specify an address (or range of address) of retired word line(s)—e.g., of respective memory cells coupled to the retired word lines. The control logic can then cause a pre-program pulse (e.g., first pulse) to be applied to all of the word lines to reset the respective memory cells to a high voltage threshold distribution—e.g., a high voltage threshold can vary for each memory cell resulting in a distribution of the high voltage threshold for the memory cells when the pre-program pulse is applied. The control logic can also cause a second pulse to be applied to all valid word lines and cause a counter biasing pulse (e.g., third pulse) to be applied to the retired word lines. For example, the second pulse can cause the valid word lines to be at a low voltage and the third pulse can cause the retired word lines to be biased to a higher voltage than the valid word lines.

The control logic can then cause a pulse (e.g., fourth pulse) to be applied to a source line coupled with the word lines to erase the respective memory cells coupled with the valid word lines and program a random pattern (e.g., random bits) to the respective memory cells of the retired word lines. That is, biasing the source line causes a positive potential to transfer up a respective pillar (e.g., a vertical conductive trace). When a word line is at a low voltage and the pillar is at a high voltage (e.g., at the positive potential), holes are injected in the memory cells and allows charge to be pulled off the memory cell—e.g., allows the memory cell to be erased. When a retired word line is at a higher voltage (e.g., a higher voltage than the low voltage of the valid word lines), the erase is less effective. That is, there are less holes injected (e.g., the higher voltage causes an increased resistance) in the memory cells and less charge is pulled from each memory cell. Accordingly, the retired word lines are inhibited from being erased and a random distribution is programmed to the respective memory cells coupled to the retired word lines. Additionally, the control logic (or memory sub-system controller) can monitor which word lines are retired for an erase check or last page programmed operation. For example, the control logic or the memory sub-system controller can maintain a table (e.g., a table of addresses) that indicates which word lines (and respective memory cells) are retired and were accordingly not erased so that during an erase page check the memory device can verify the valid word lines are erased while not checking the retired word lines. Alternatively, the memory device can modify the erase check algorithm to indicate a higher threshold voltage at which to check the word lines—e.g., the memory device can increase the threshold voltage such that the erased word lines are below the threshold while most of the retired word lines are above the threshold and therefore not checked.

Advantages of this approach include, but are not limited to, improved performance in the memory device and reductions in write latency. The erase operation described herein can both erase the valid word lines and program (e.g., inhibit the erasure of) the retired word lines. That is, the memory device can avoid programming the dummy data during a programming operation. This can eliminate the transfer of dummy data from the memory sub-system controller to the control logic and avoid pausing the program operation.

Accordingly, the memory device can reduce the time for a write operation and program the data provided by the host quicker. Additionally, the methods described herein can be used to perform a secure erase. For example, the memory device can treat every word line like a retired word line, causing the random pattern to be programmed across all word lines. The memory device can then treat each word line as valid and erase all of the data. This can avoid an unauthorized user from ascertaining the data previously stored.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory device 130 includes an erase management component 113 that can oversee, control, and/or manage data access operations, such as erase operations, performed on a non-volatile memory device, such as memory device 130, of memory sub-system 110. An erase operation, for example, can include erasing data stored at respective memory cells coupled to valid word lines (e.g., unretired word lines or word lines storing data for host system 120) and program (e.g., inhibit the erasure of) retired word lines (e.g., word lines not storing data for the host system 120 or word lines that are corrupt or exceed error thresholds) at the memory array 104. In some embodiments, the erase management component 113 can receive an erase command from the memory sub-system controller 113. The memory sub-system controller 113 can maintain (e.g., store) a table or register that indicates which word lines of the memory device 130 are retired. That is, the erase management component 113 (or a different component of the local media controller 135 or memory sub-system controller 115) can perform scan operations or otherwise determine which memory cells and respective word lines are corrupt and above an error threshold. The erase management component 113 can indicate the corrupt word lines to the memory sub-system controller 115. Accordingly, the memory sub-system controller 115 can send commands to the local media controller 135 or erase management component 113 indicating the retired word lines. The memory sub-system controller 115 (or the local media controller 135) can also maintain the table or register of retired word lines for erase check operations or last page programmed operations—e.g., to refrain from verifying an erase operation at respective memory cells coupled with the retired word lines or refrain from verifying a program operation at respective memory cells coupled with the retired word lines. In some embodiments, the erase command can also indicate the type of memory cells in the memory array—e.g., the erase command can indicate an erase at single level cells (SLC), multilevel cells (MLC), triple level cells (TLC), quadruple level cells (QLC), and so forth.

Erase management component 113 is responsible for causing certain voltages to be applied (or indicating which voltages to apply) to word lines of memory device 130 during the erase operation. For example, the erase management component 113 can cause a pre-program pulse (e.g., first pulse) to be applied to all word lines in the memory array. In some embodiments, this can cause the respective memory cells to be reset to a high threshold voltage—e.g., a high voltage threshold distribution as memory cells can have varying high threshold voltages. The erase management component 113 can cause a second pulse to be applied to valid word lines (e.g., word lines not specified in the erase command as retired word lines) to bias the valid word lines to a voltage. The erase management component 113 can also cause a counter biasing pulse (e.g., third pulse) to be applied to bias the retired word lines to second voltage greater than the low voltage of the valid word lines. The erase management component 113 can select a magnitude of the third pulse based on the type of memory cells indicated in the erase command—e.g., select the second voltage to which the retired word lines are to be biased based on the type of memory cells. For example, the erase management component 113 can select a greater magnitude for the third pulse when the memory cells are QLC memory cells and a smaller magnitude for the third pulse when the memory cells are SLC memory cells. In some embodiments, the erase management component 113 can cause a fourth pulse to be applied to the source line to erase the respective memory cells coupled to the valid word lines and program the respective memory cells coupled to the retired word lines as described with reference to FIG. 3. By programming the retired word lines with dummy data (e.g., a random data pattern) during the erase operation, the memory device 130 can improve write performance during a program operation.

In some embodiments, the memory sub-system controller 115 includes at least a portion of erase management component 113. For example, the memory sub-system controller 115 can include a processor 117 (e.g., a processing device) configured to execute instructions stored in local memory 119 for performing the operations described herein. In some embodiments, program management component 113 is part of the host system 110, an application, or an operating system. In other embodiment, local media controller 135 includes at least a portion of erase management component 113 and is configured to perform the functionality described herein. In such an embodiment, erase management component 113 can be implemented using hardware or as firmware, stored on memory device 130, executed by the control logic (e.g., erase management component 113) to perform the operations related to program recovery described herein.

Figure 1B:
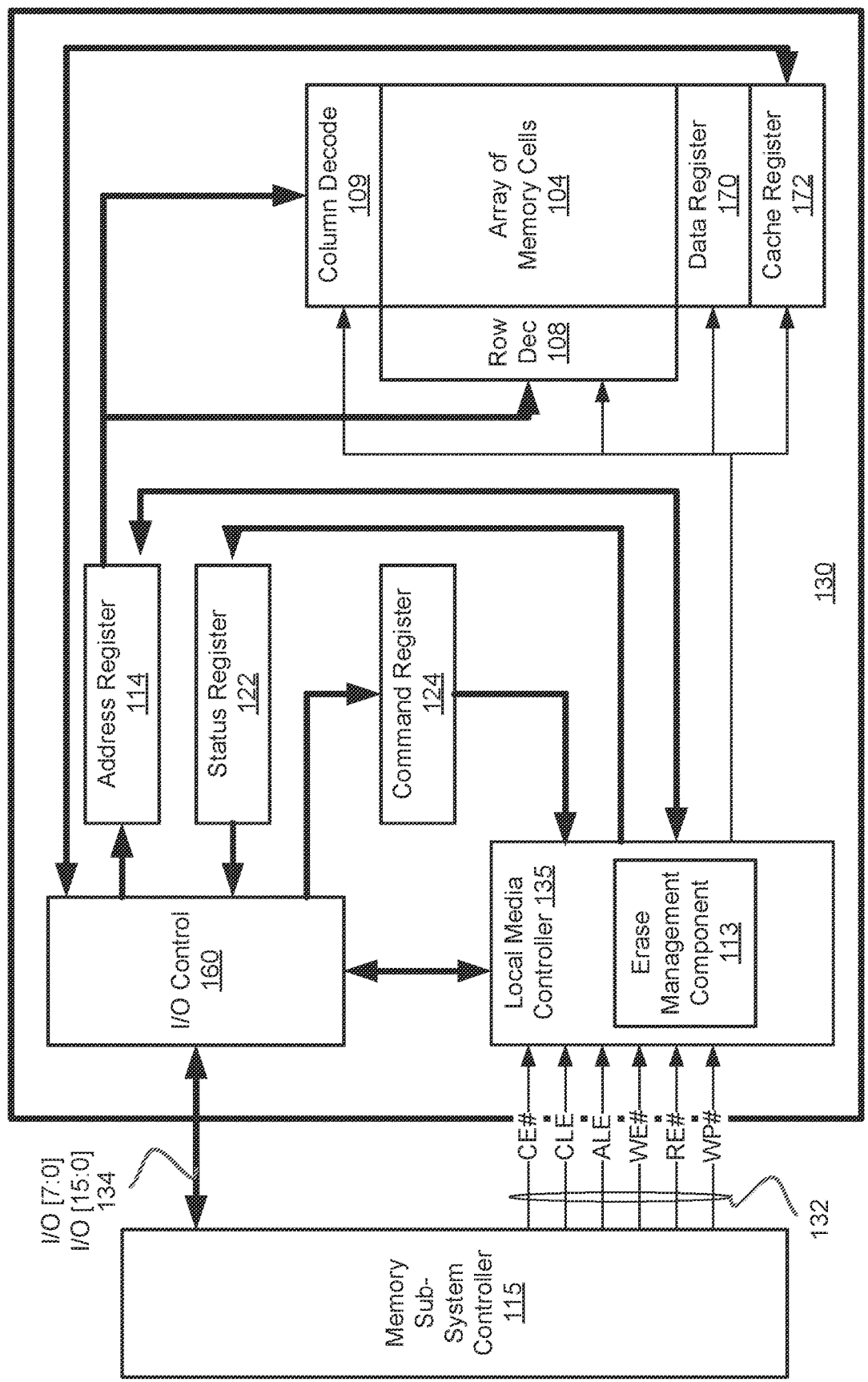
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states. In one embodiment, the array of memory cells 104 (i.e., a "memory array") can include a number of sacrificial memory cells used to detect the occurrence of read disturb in memory device 130, as described in detail herein.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. In an embodiment, the local media controller 135 can include erase management component 113 as described with reference to FIG. 1A.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
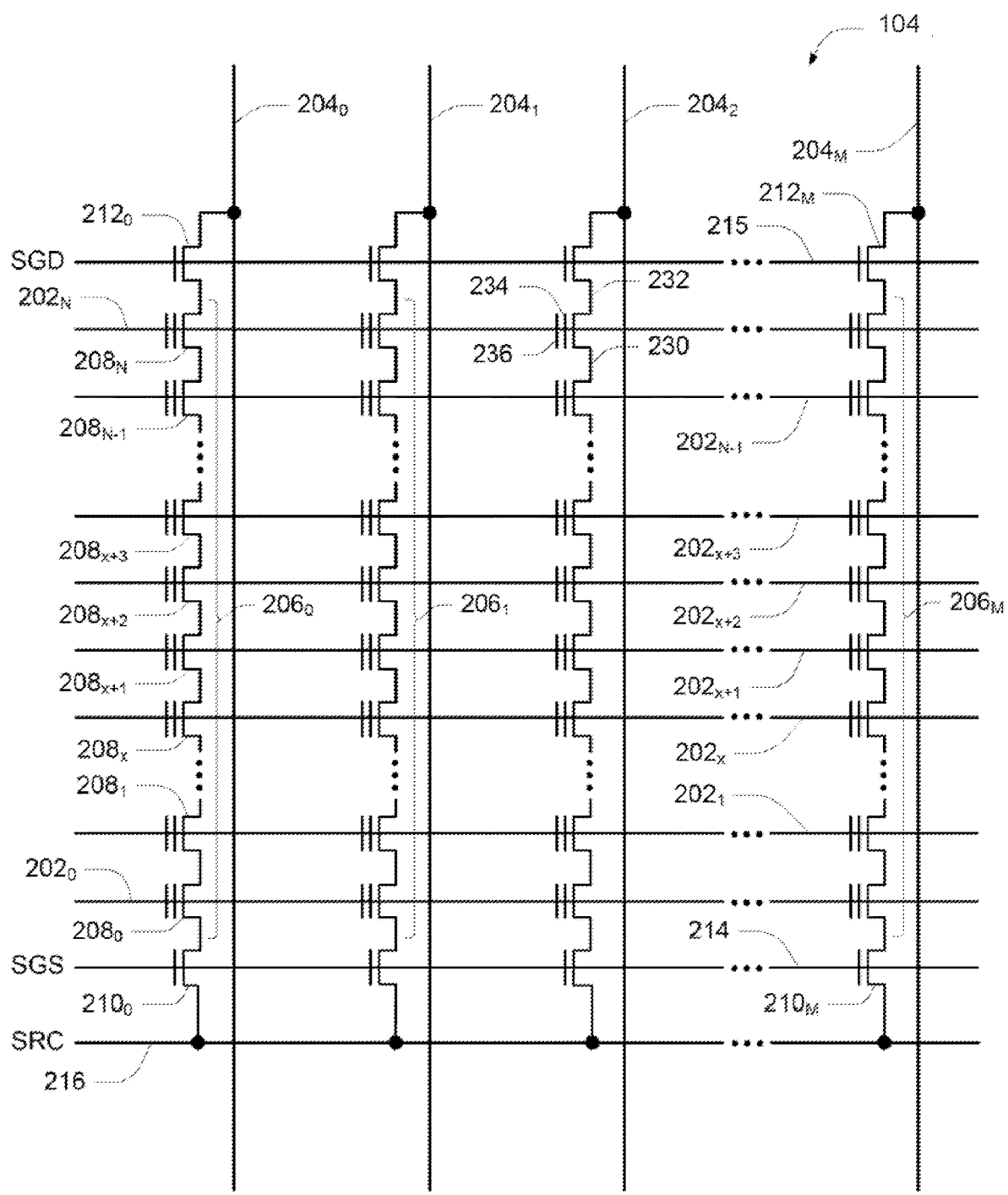
FIG. 2 is a schematic of portions of an array of memory cells as could be used in a memory of the type described with reference to FIG. 1B, in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string 2060. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

In one embodiment, one or more of NAND strings 206 can be designated as sacrificial strings and used to detect read disturb in memory array 104. For example, NAND string $206_0$ can be designated a sacrificial string. In other embodiments, there can be different NAND strings or additional NAND strings, including two or more NAND strings, which are designated as sacrificial strings. In one embodiment, NAND string $206_0$ can include at least one sacrificial memory cell 208 from each wordline 202. These sacrificial memory cells 208 in the sacrificial memory string $206_0$ are not made available to the memory sub-system controller, and thus are not used to store host data. Rather, the sacrificial memory cells 208 remain in a default state (e.g., an erased state) or are programmed to a known voltage (e.g., a voltage corresponding to a known state). When a read operation is performed on any of the wordlines in memory array 104, a read voltage is applied to the selected wordline and a pass voltage is applied to the unselected wordlines, and the sacrificial memory cells will experience the same read disturb effects as the memory cells storing host data. When the read disturb effects become strong enough, one or more of the sacrificial memory cells can shift from the default or known state to a different state (e.g., to a state associated with a higher voltage level). Thus, local media controller 135 can perform a string sensing operation on the string of sacrificial memory cells to determine whether read disturb has occurred. In one embodiment, to perform the string sensing operation a predefined read voltage is applied to each wordline 202 concurrently, and the current through the sacrificial string $206_0$ is sensed. If any of the sacrificial memory cells 208 in the sacrificial string $206_0$ has shifted to a different state, the sacrificial string $206_0$ will not conduct and current will not flow. Thus, in such a situation, local media controller 135 can determine that read disturb is present in the block of memory array 104.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3A:
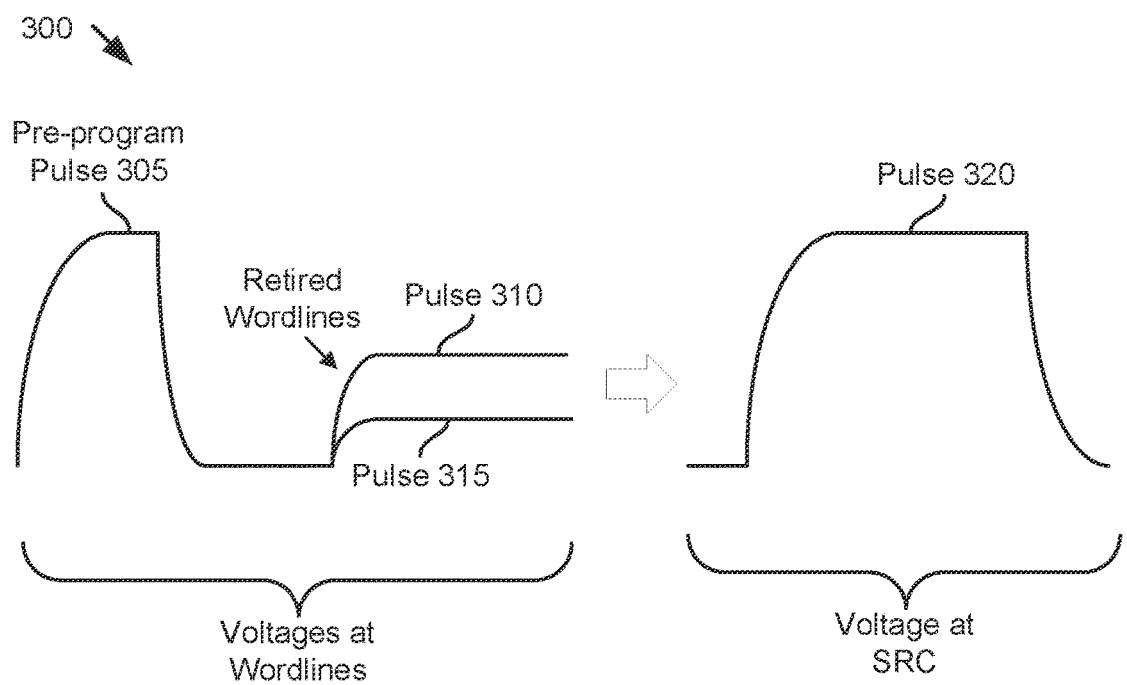
FIGS. 3A and 3B illustrate a diagrams for programming selectively word lines during an erase operation in a memory device, in accordance with some embodiments of the present disclosure.
Figure 3B:
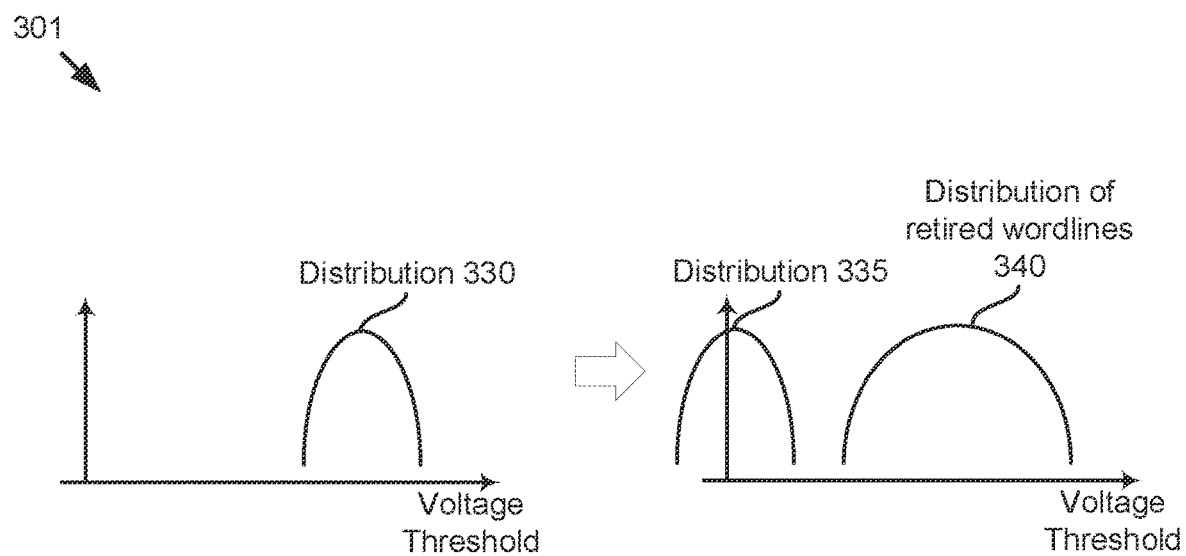

FIGS. 3A and 3B illustrate diagrams 300 and 301, respectively, for programming selective word lines during an erase operation in a memory device, in accordance with some embodiments of the present disclosure. Diagram 300 illustrates pulses applied to word lines (e.g., valid word lines 202 and retired word lines 202) and a common source (SRC 216) during an erase operation at a memory device—e.g., memory device 130 as described with reference to FIG. 1. In some embodiments, pulses can be applied by an erase management component 113 or a local media controller 135 as described with reference to FIG. 1. Diagram 301 can illustrate a voltage threshold distribution of respective memory cells 208 coupled to the word lines 202 after pulses are applied to the word lines 202.

After receiving an erase command, erase management component 113 (or local media controller 135) can cause a pre-program pulse 305 to be applied to all word lines of a block in a memory array 104 of the memory device 130. In some embodiments, the pre-program pulse 305 can bias all the word lines to reset the respective memory cells 208 coupled to the word lines 202 to a high voltage threshold. In one embodiment, the voltage distribution of the respective memory cells 208 after the pre-program pulse 305 is represented by distribution 330 in diagram 301. That is, the high voltage threshold can be different between memory cells 208 due to deviations between the memory cells 208 as a result of the manufacturing process. Accordingly, by causing the pre-program pulse 305 to be applied, the memory cells 208 can have a distribution 330 of a high voltage threshold.

After applying the pre-program pulse 305, the erase management component 113 can apply a pulse 310 to retired word lines 202 and a pulse 315 to valid word lines 202 (e.g., word lines 202 that are not retired). In some embodiments, the pulse 310 can be applied concurrent with pulse 315—e.g., pulses are applied to the valid and retired word lines 202 concurrently. In some embodiments, the erase management component 113 can determine which word lines 202 are retired based on address indicated in the erase command. That is, local media controller 135 can perform periodic scan operations or other reliability diagnostics (e.g., determining read window budget (RWB) for each word line 202) to determine which word lines 202 are corrupt or can no longer store data for the host system reliably. In some embodiments, the position of the retired word lines 202 is random—e.g., any given word line 202 can become corrupted and retired. In some examples, the local media controller 135 can transmit which word lines 202 are determined to be corrupt (e.g., should be retired) to the memory sub-system controller 115 after performing the scan operation or other reliability diagnostics. The memory sub-system controller 115 can track or record respective addresses of the retired word lines 202 in a register or a logical table. When the memory sub-system controller 115 sends the erase command, the memory sub-system controller 115 can indicate an address (or range of addresses) of the retired word lines 202—e.g., enable a feature to program (or inhibit the erasure of) the retired word lines 202 during the erase operation. Additionally, the erase command can indicate the type of memory cells 208 to erase during the erase operation—e.g., indicate whether the memory cells 208 are single level cells (SLC), multilevel cells (MLC), triple level cells (TLC), quadruple level cells (QLC), etc. The erase management component 113 can select the magnitude of the pulse 310 based on the type of memory cell 208 indicated in the erase command. That is, the erase management component 113 can store a value associated with a magnitude for the pulse 310 to be applied for each type of memory cell 208 and then select the respective magnitude for the pulse 310 based on the type of memory cell 208 indicated in the erase command. For example, the erase management component 113 can select a first magnitude for SLC memory cells and a second magnitude for TLC memory cells, where the second magnitude is greater than the first magnitude. In some embodiments, the greater the magnitude of pulse 310, the more resistant the respective memory cells coupled to the retired word lines 202 are to being erased as described with reference to the pulse 320. In some embodiments, the pulse 315 can cause the valid word lines 202 to be biased to a low voltage (e.g., a first voltage). In some examples, pulse 310 can cause the retired word lines 202 to be biased to a high voltage (e.g., a second voltage) that is greater than the low voltage.

After applying pulse 310 and pulse 315, the erase management component 113 can apply a pulse 320 to common source (SRC 216). In some embodiments, applying the pulse 320 to the SRC 216 can cause a positive potential to transfer up the pillar (e.g., up the string of memory cells 206 from the SRC 216 to the SGD 215). Because the valid word lines 202 are at a low potential (e.g., biased to the low voltage after pulse 315) and the pillar is at a high potential (e.g., after applying the pulse 320 at the SRC 216), holes can be injected into the memory cells 208 and pull charge of the memory cells 208. For example, the memory cells 208 coupled to the valid word lines 202 can be erased. In one embodiment, respective memory cells 208 coupled to the valid word lines 202 can have a voltage threshold distribution as represented by distribution 335 after the pulse 320 is applied. That is, the respective memory cells 208 coupled to the word lines 202 can be erased and be at a low voltage threshold. In some embodiments, because the retired word lines 202 are at a higher potential (e.g., biased to the second voltage), the difference between the potentials of the retired word lines 202 and the pillars (e.g., string of memory cells 206) is less than the difference between the potentials of the valid word lines 202 and the pillar. Because the retired word lines 202 are at a higher potential, the respective memory cells 208 coupled to the retired word lines 202 are more resistant to being erased. For example, the higher potential can cause a reduced number of holes to be injected into the respective memory cells 208 coupled to the retired word lines 202 and less charge can be pulled off—e.g., the respective memory cells 208 coupled to the retired word lines 202 are not erased or driven to the low voltage threshold. Accordingly, in one embodiment, the respective memory cells 208 coupled to the retired word lines 202 can have a voltage threshold distribution as represented by distribution 340. That is, the respective memory cells coupled to the retired word lines 202 can be programmed to a random pattern, where the voltage thresholds are of the memory cells 208 have a wide range as illustrated in diagram 301. In some embodiments, if the erase management component 113 selects a greater magnitude for the pulse 310, the potential difference between the retired word lines 202 and the pillars can be smaller and cause the memory cells 208 to be more resistant to the erase operation. Accordingly, a greater magnitude for the pulse 310 can cause a wider distribution—e.g., distribution of retired word lines 340 can be wider or span a greater number of voltage thresholds.

In some embodiments, the local media controller 135 can receive a program command after erasing the valid word lines 202 and programming the retired word lines 202 as described herein. In some embodiments, the program command can specify which word lines 202 are retired—e.g., an address of a retired word line 202 or a range of addresses corresponding to the retired word lines 202 in the block. Because the respective memory cells 208 coupled to the retired word lines 202 were programmed during the erase operation, the local media controller 135 can refrain from programming the respective memory cells 208 during the program operation—e.g., the local media controller 135 can skip over memory cells 208 coupled to the retired word lines 202 based on the address or range of addresses indicated in the program command received from the memory sub-system controller 115. This can improve the performance of the memory device and reduce a time to perform the program operation.

In some embodiments, the local media controller 135 can receive a last page programmed command after the erase operation or the program operation. In such embodiments, the last page programmed command can include address(es) of retired word lines 202 so the local media controller 135 can refrain from checking the respective pages coupled to the retired word lines 202. In some embodiments, the erase management component 113 can receive an erase check command as described with reference to FIG. 5. In such embodiments, the erase management component 113 can refrain from checking or verifying the erase at the respective memory cells 208 coupled with the retired word lines 202 as described with reference to FIG. 5.

Figure 4:
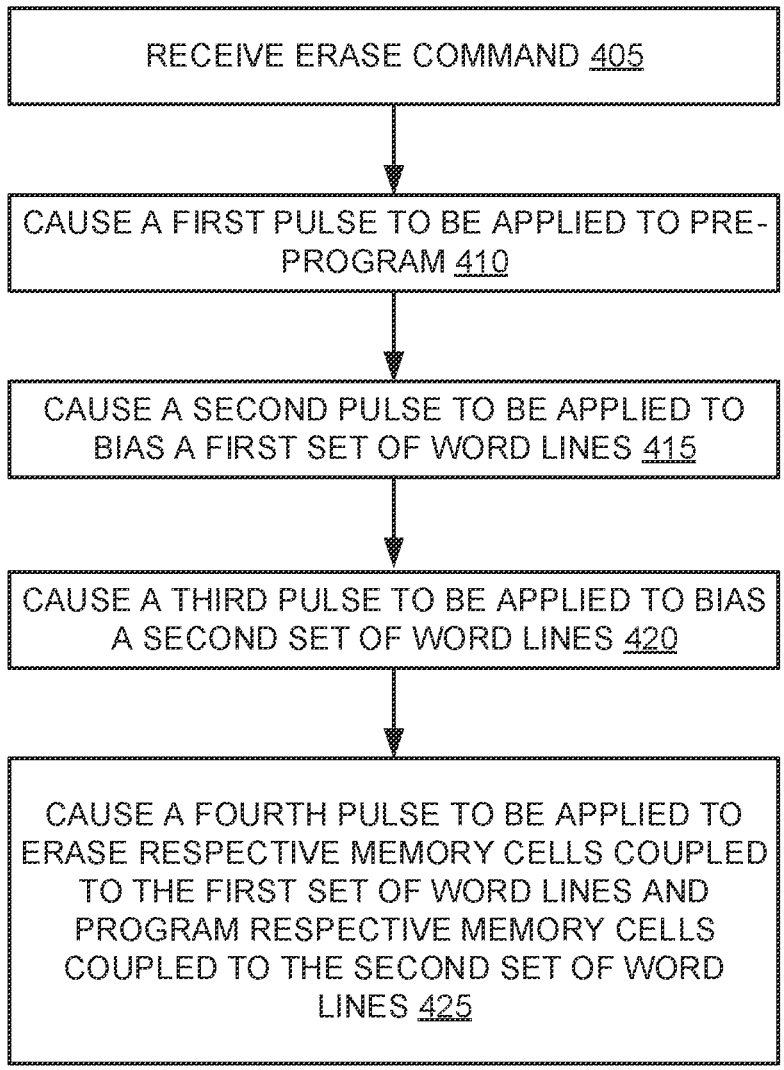
FIG. 4 is flow diagram of an example method of verifying programming selective word lines during an erase operation in a memory device, in accordance with embodiments of the present disclosure.

FIG. 4 is a flow diagram of an example method 400 for programming selective word lines during an erase operation in a memory device, in accordance with the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by erase management component 113 or local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, an erase command is received. For example, processing logic (e.g., erase management component 113 or local media controller 135) can receive an erase command from a memory sub-system controller 115. In some embodiments, the erase command can indicate a first set of word lines (e.g., valid word lines 202) and a second set of word lines (e.g., retired word lines 202 where the respective memory cells coupled to the second set of word lines store dummy data). For example, the erase command can indicate an address (memory addresses or range of addresses) corresponding to the second set of word lines (or single word line). In some embodiments, the memory sub-system controller 115 can identify the second set of word lines (e.g., send the addresses of the second set of word lines) based on a scan operation or other reliability diagnostic operation as described with reference to FIG. 3. For example, the processing logic can scan each word line of a plurality of word lines before receiving the erase command. In such embodiments, the processing logic can determine the second set of word lines satisfy an error threshold (e.g., a number of errors at the word line exceed an error threshold). In some embodiments, the processing logic can send the addresses (or address) of the second set of word lines to the memory sub-system controller 115.

At operation 410, a first pulse is applied. For example, the processing logic can cause a first pulse, such as pre-program pulse 305, to be applied to all word lines (e.g., the first set of word lines and the second set of word lines). In some embodiments, the processing logic can apply the first pulse to pre-program all of the word lines—e.g., reset the respective memory cells coupled to the word lines to a high threshold voltage as described with reference to FIG. 3.

At operation 415, a second pulse is applied. For example, the processing logic can cause a second pulse, such as pulse 310, to be applied to the first set of word lines. In some embodiments, the processing logic can cause the first set of word lines to be biased to a first voltage (e.g., a low voltage as described with reference to FIG. 3) based on applying the second pulse.

At operation 420, a third pulse is applied. For example, the processing logic can cause a third pulse, such as pulse 315 (e.g., a counter bias pulse) to be applied to second set of word lines. In some embodiments, the processing logic can cause the second set of word lines to be biased to a second voltage (e.g., a high voltage as described with reference to FIG. 3) based on applying the third pulse. In some embodiments, the second voltage is greater than the first voltage—e.g., the second set of word lines are biased to a greater voltage than the first set of word lines. In some embodiments, the processing logic can cause the second pulse and the third pulse to be applied concurrently. In at least one embodiment, the processing logic can select a magnitude of the third pulse based on a number of bits stored at each memory cell—e.g., based on a type of memory cell as described with reference to FIG. 3.

At operation 425, a fourth pulse is applied. For example, the processing logic can cause a fourth pulse, such as pulse 320, to be applied to a source line coupled with the plurality of word lines-cause the source line to go to a high voltage as described with reference to FIG. 3. In some embodiments, applying the fourth pulse can erase the respective memory cells coupled to the first set of word lines and program the respective memory cells coupled to the second set of word lines as described with reference to FIG. 3—e.g., based on a potential difference between the source line, the first set word lines, and the second set of word lines. In some embodiments, the fourth pulse can cause the respective memory cells coupled to the second set of word lines to be programmed according to a random data pattern—e.g., programmed to a distribution 340. In some embodiments, the processing logic can receive a program command after performing the erase operation. In such embodiments, the program command can include the address(es) of the second set of word lines. Accordingly, the processing logic can refrain from programming (e.g., skip programming) respective memory cells coupled to the second set of word lines. In some embodiments, the processing logic can receive an erase command that indicates to program (e.g., inhibit the erasure of) all of the word lines—e.g., each word line is treated like a retired word line. In such embodiments, the processing logic can apply the third pulse to all of the word lines causing a random distribution to be programmed to all of the respective memory cells. In some embodiments, the processing logic can then receive a second erase command that indicates to erase all of the word lines e.g., treat each word line like the first set of word lines. Accordingly, the processing logic can erase all of the respective memory cells. By programming all of the respective memory cells to the random distribution during the erase operation and then subsequently erasing them all, the processing device can perform a secure erase—e.g., ensure an unauthorized user cannot obtain or recreate the data stored at the respective memory cells before the secure erase.

Figure 5:
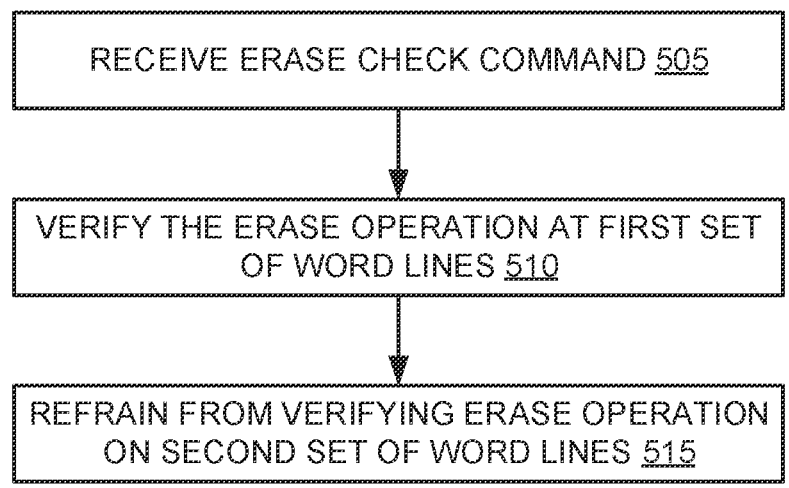
FIG. 5 is a flow diagram of an example method of programming selective word lines during an erase operation in a memory device, in accordance with some embodiments of the present disclosure.

FIG. 5 flow diagram of an example method 500 for performing an erase check after programming selective word lines during an erase operation in a memory device, in accordance with the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by erase management component 113 or local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, an erase check command is received. For example, processing logic (e.g., erase management component 113 or local media controller 135) can receive an erase check command. In some embodiments, the processing logic can receive the erase check after performing an erase operation as described with reference to FIG. 4—e.g., after executing an erase operation to erase the first set of word lines and programming the second set of word line, where programming the second set of word lines is based on biasing the second set of word lines to a first voltage different than a second voltage the first set of word lines are biased to during the erase operation. For example, the memory sub-system controller 115 can send the erase check command to verify whether the erase operation was successful—e.g., whether the respective memory cells coupled to valid word lines 202 were erased. In some embodiments, because the respective memory cells coupled to retired word lines 202 were programmed during the erase operation, the processing logic can refrain from or otherwise skip checking the respective memory cells coupled to the retired word lines 202—e.g., the erase check command can indicate to verify the erase operation for the first set of word lines and refrain from verifying the erase operation for the second set of word lines. In some embodiments, the local media controller 135 can track the word lines that are retired for the erase check operation—e.g., maintain a table or register that indicates addresses of the retired word lines. In some embodiments, the memory sub-system controller 115 can maintain a table or register that indicates the addresses of the retired word lines. In such embodiments, the erase check command can include an address (or a range of addresses) corresponding to the second set of word lines—e.g., the retired word lines.

At operation 510, the first set of word lines can be verified. For example, the processing logic can verify the erase operation at the first set of word lines 510. In some embodiments, the erase check command can include an address or range of addresses for the second set of word lines. Accordingly, the processing logic can check or verify the erase operation for each word line not included in the erase check command address—e.g., the processing logic can verify each word line of the first set of word lines and refrain from checking each word line of the second set of word lines based on the addresses of the second set of word lines being indicated in the erase check command. In some embodiments, the erase check command can indicate a threshold voltage, where the erase check command indicates to check respective memory cells or word lines below the threshold voltage and refrain from checking respective memory cells or word lines above the threshold voltage. In some embodiments, the threshold voltage can be selected based on the threshold distribution of the second set of word lines (retired word lines). That is, the erase check command can indicate a threshold voltage within the retired word lines distribution 340 such that the respective memory cells below that (e.g., the respective memory cells coupled to the first set of word lines) can be verified.

At operation 515, a second set of word lines cannot be verified. For example, the processing logic can refrain from verifying the erase operation at the second set of word lines. In some embodiments, the erase check command (or a table/register stored at the local media controller 135) can indicate addresses of the second set of word lines—e.g., the retired word lines. In such embodiments, the processing logic can refrain from checking or verifying the erase operation at the second set of word lines during the erase check operation. That is, because the respective memory cells coupled to the second set of word lines were intentionally not erased, the processing logic can refrain from checking erasure at the respective memory cells coupled to the second set of word lines. In some embodiments, the erase check command can indicate a threshold voltage. In such embodiments, the processing logic can refrain from checking respective memory cells above the voltage threshold indicated in the erase check command—e.g., the majority of the respective memory cells coupled to the second set of word lines. In either embodiment, the processing logic can verify the respective memory cells coupled to the first set of word lines and refrain from verifying the respective memory cells coupled to the second set of word lines.

Figure 6:
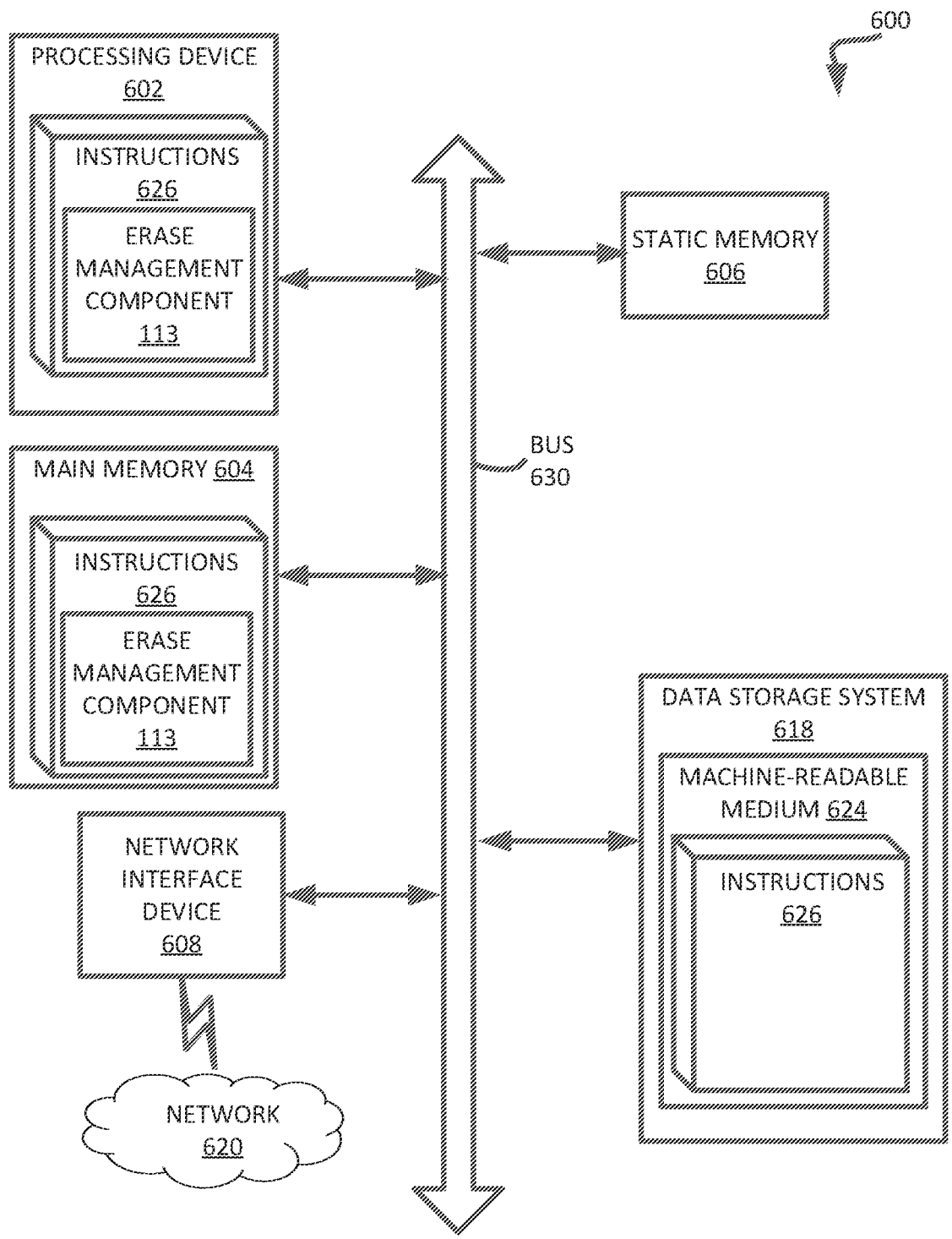
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the erase management component 113 of FIG. 1 to perform a scan operation). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 404 can correspond to the memory sub-system 110 of FIG. 1.

In one embodiment, the instructions 626 include instructions to implement functionality corresponding to an erase management component 113 to perform a program operation for the processing device 602. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a memory array; and
    control logic, operatively coupled with the memory array, to perform operations comprising:
        causing a first pulse to be to applied to a plurality of word lines coupled to respective memory cells in the memory array during an erase operation;
        causing a second pulse to be applied to a first set of word lines of the plurality of word lines to bias the first set of word lines to a first voltage;
        causing a third pulse to be applied to a second set of word lines of the plurality of word lines to bias the second set of word lines to a second voltage, wherein the second voltage has a greater magnitude than the first voltage, and wherein the second set of word lines are retired word lines; and
        causing a fourth pulse to be applied to a source line of the memory array to erase the respective memory cells coupled to the first set of word lines and to program the respective memory cells coupled to the second set of word lines.

2. The memory device of claim 1, wherein the respective memory cells coupled to the second set of word lines are programmed according to a random data pattern.

3. The memory device of claim 1, wherein the respective memory cells coupled to the second set of word lines store dummy data.

4. The memory device of claim 1, wherein the control logic is to further perform operations comprising:
    receive an erase command corresponding to the erase operation before causing the first pulse to be applied, wherein the erase command indicates the first set of word lines and the second set of word lines.

5. The memory device of claim 4, wherein the erase command indicates a range of memory addresses corresponding to the second set of word lines.

6. The memory device of claim 1, wherein the control logic is to further perform operations comprising:
    scanning each word line of the plurality of word lines before causing the first pulse to be applied;
    determining the second set of word lines satisfy an error threshold, wherein causing the third pulse to be applied is based at least in part on determining the second set of word lines satisfy the error threshold.

7. The memory device of claim 1, wherein a magnitude of the third pulse is based at least in part on a number of bits stored at each memory cell.

8. A method, comprising:
    causing a first pulse to be to applied to a plurality of word lines coupled to respective memory cells in a memory array during an erase operation;
    causing a second pulse to be applied to a first set of word lines of the plurality of word lines to bias the first set of word lines to a first voltage;
    causing a third pulse to be applied to a second set of word lines of the plurality of word lines to bias the second set of word lines to a second voltage, wherein the second voltage has a greater magnitude than the first voltage, and wherein the second set of word lines are retired word lines; and
    causing a fourth pulse to be applied to a source line of the memory array to erase the respective memory cells coupled to the first set of word lines and to program the respective memory cells coupled to the second set of word lines.

9. The method of claim 8, wherein the respective memory cells coupled to the second set of word lines are programmed according to a random data pattern.

10. The method of claim 8, wherein the respective memory cells coupled to the second set of word lines store dummy data.

11. The method of claim 8, further comprising:
    receiving an erase command corresponding to the erase operation before causing the first pulse to be applied, wherein the erase command indicates the first set of word lines and the second set of word lines.

12. The method of claim 11, wherein the erase commands command indicates a range of memory addresses corresponding to the second set of word lines.

13. The method of claim 8, further comprising:
scanning each word line of the plurality of word lines before causing the first pulse to be applied; and
determining the second set of word lines satisfy an error threshold, wherein causing the third pulse to be applied is based at least in part on determining the second set of word lines satisfy the error threshold.

14. The method of claim 8, wherein a magnitude of the third pulse is based at least in part on a number of bits stored at each memory cell.

15. A memory device comprising:
a memory array; and
control logic, operatively coupled with the memory array, to perform operations comprising:
receiving an erase command indicating to erase a first set of word lines and program a second set of word lines;
responsive to receiving the erase command, executing an erase operation to erase the first set of word lines and programming the second set of word lines, wherein programming the second set of word lines is based at least in part on biasing the second set of word lines to a first voltage different than a second voltage to which the first set of word lines are biased to during the erase operation; and
receiving an erase check command indicating to verify the erase operation responsive to executing the erase operation.

16. The memory device of claim 15, wherein the erase check command indicates to verify the first set of word lines and refrain from verifying the second set of word lines.

17. The memory device of claim 16, wherein the erase check command includes addresses of the second set of word lines.

18. The memory device of claim 15, wherein the erase check command indicates to check memory cells below a threshold voltage.

19. The memory device of claim 15, wherein respective memory cells coupled to the second set of word lines are programmed according to a random data pattern.

20. The memory device of claim 15, wherein respective memory cells coupled to the second set of word lines store dummy data.

* * * * *